(12) United States Patent
Matsumiya et al.

(10) Patent No.: US 6,344,990 B1
(45) Date of Patent: Feb. 5, 2002

(54) DRAM FOR STORING DATA IN PAIRS OF CELLS

(75) Inventors: Masato Matsumiya; Shinya Fujioka; Kimiaki Satoh; Toru Miyabo, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/652,015

(22) Filed: Aug. 31, 2000

(30) Foreign Application Priority Data

Aug. 31, 1999 (JP) .......................................... 11-246687
Aug. 14, 2000 (JP) .......................................... 12-245847

(51) Int. Cl.[7] ................................................ G11C 5/06
(52) U.S. Cl. ........................ 365/63; 365/149; 365/190; 365/205
(58) Field of Search ........................ 365/63, 190, 149, 365/205, 51, 129, 189.01

(56) References Cited

U.S. PATENT DOCUMENTS 4,916,666 A    4/1990  Fukuhama et al.
5,555,203 A  * 9/1996  Shiratake et al. .............. 365/51
5,661,678 A    8/1997  Yoshida et al.
6,147,918 A  * 11/2000 Takashima et al. ......... 365/207

FOREIGN PATENT DOCUMENTS

JP     55-157194    12/1980
JP     61-34790     2/1986

* cited by examiner

*Primary Examiner*—Hoai V. Ho
(74) *Attorney, Agent, or Firm*—Arent Fox Kintner Plotkin & Kahn, PLLC

(57) ABSTRACT

A memory circuit including a memory cell array. The memory cell array has a first word line group connected to a pair of memory cells associated with a first bit line pair including first and third bit lines, and a second word line group, connected to a pair of memory cells associated with a second bit line pair including second and fourth bit lines. First and second sense amplifier groups are positioned one on each side of the memory array, and are connected to the first and second bit line pair, respectively. When any word line of the first word line group is driven, the first sense amplifier group is activated to drive the first word line group in reverse phase, and the second sense amplifier group is kept in the inactive state to keep the second word line group at the precharge level.

6 Claims, 9 Drawing Sheets

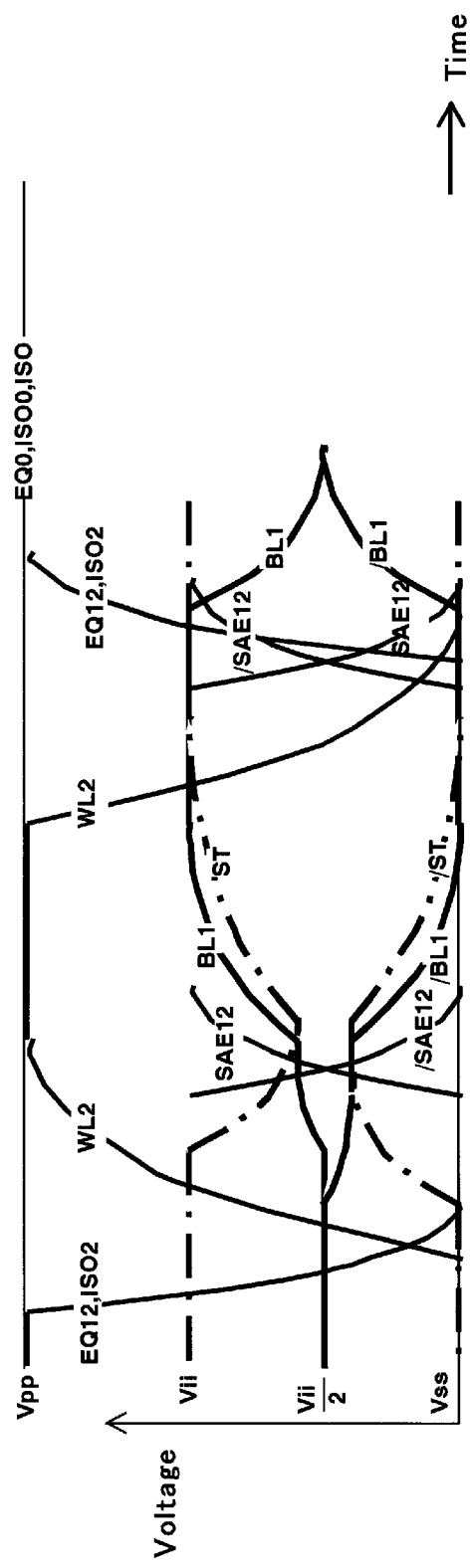
FIG. 2A  Twin Cell DRAM Read/Restore
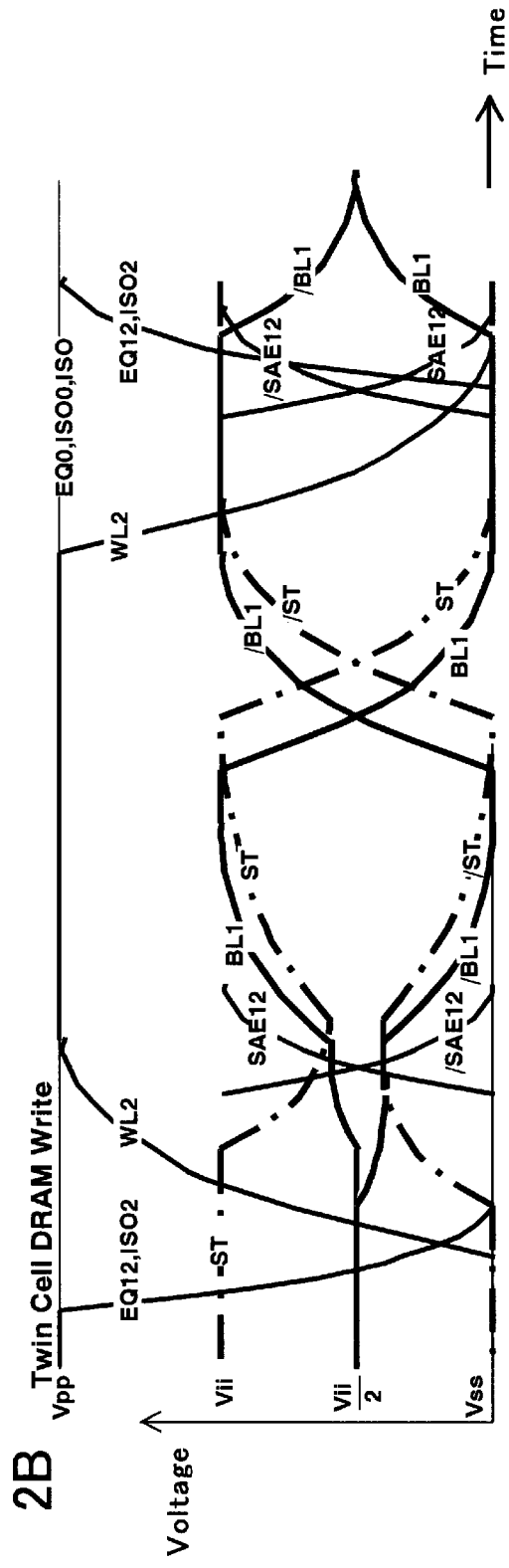
FIG. 2B  Twin Cell DRAM Write

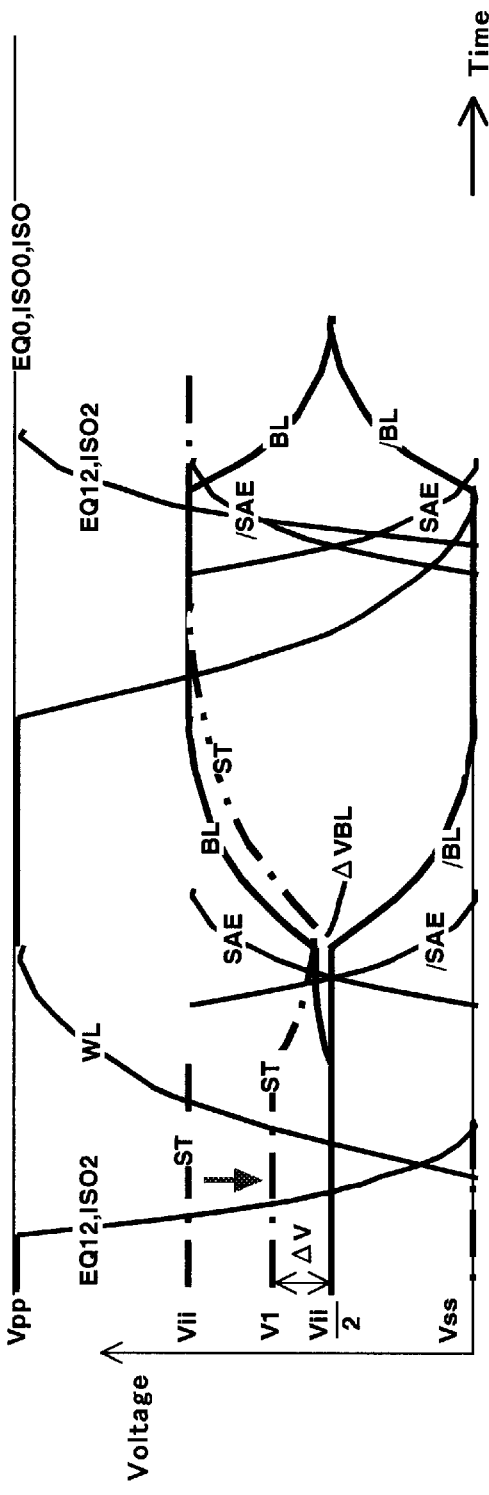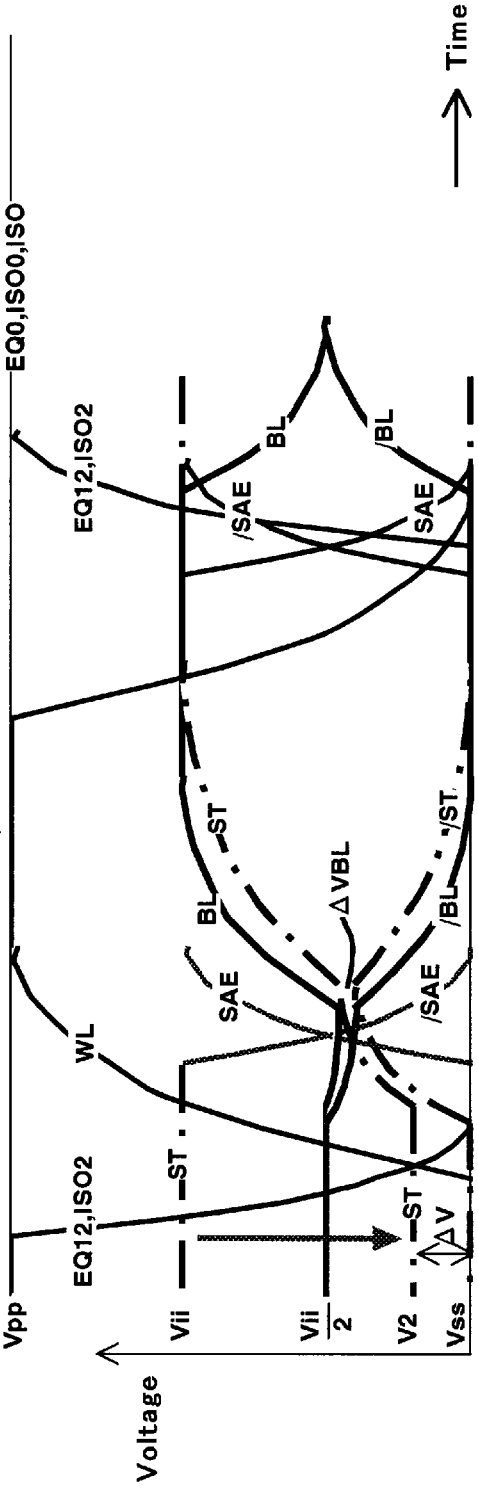
FIG. 3A Conventional DRAM Retention
FIG. 3B Twin Cell DRAM Retention Read/Restore

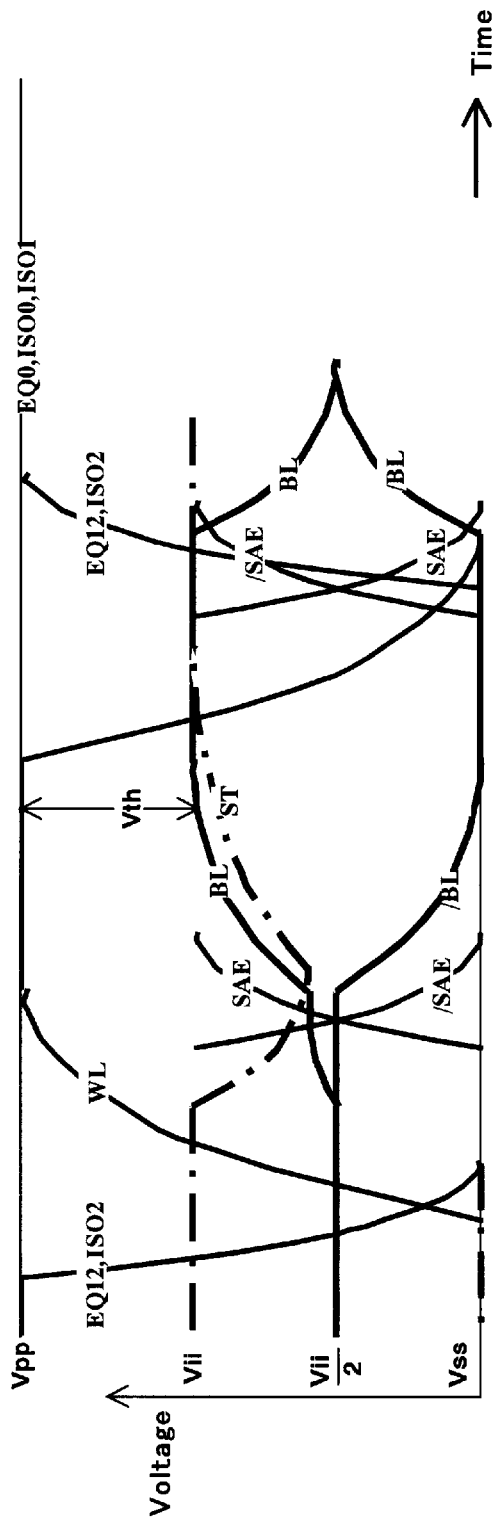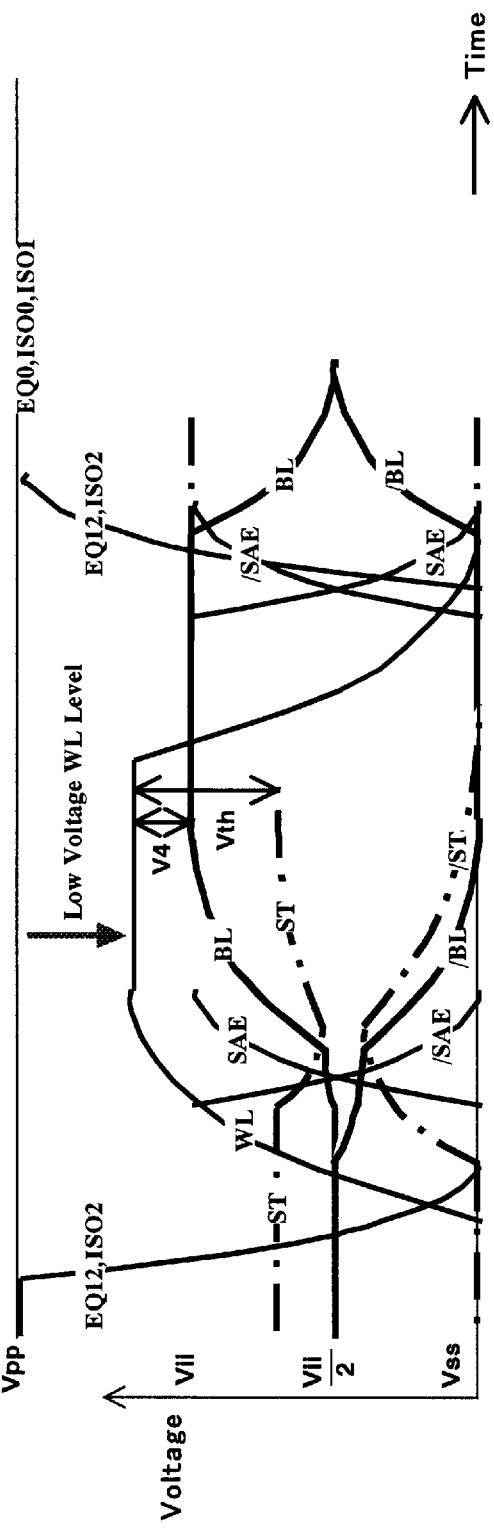
FIG. 4A Conventional DRAM Read/Restore
FIG. 4B Twin Cell DRAM Read/Restore

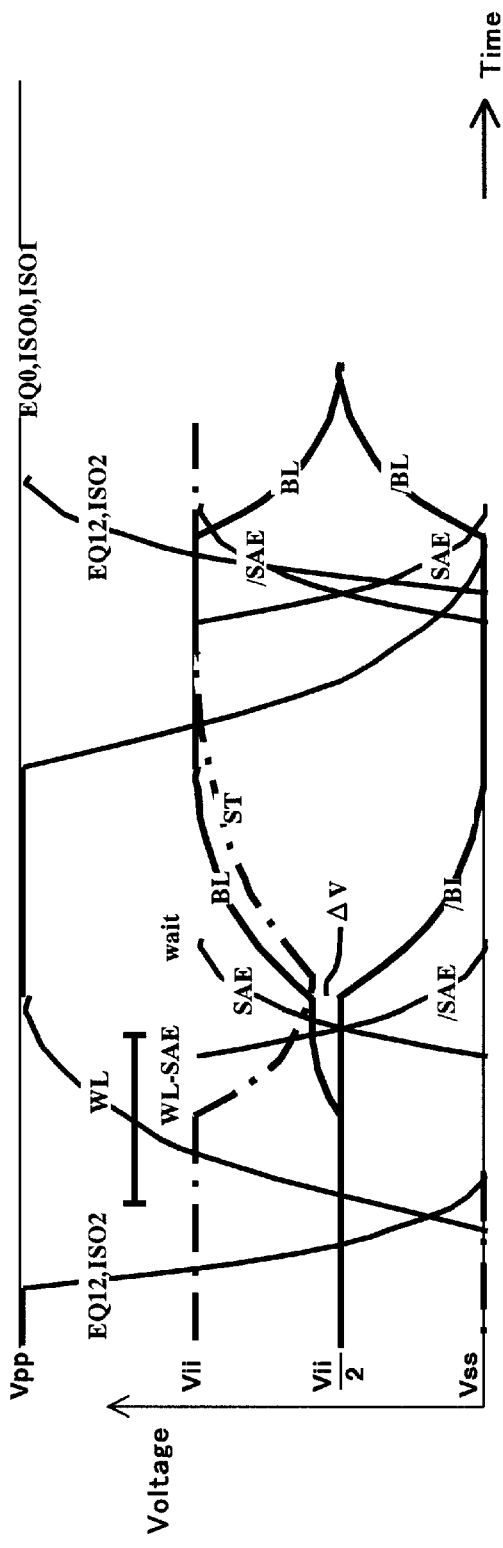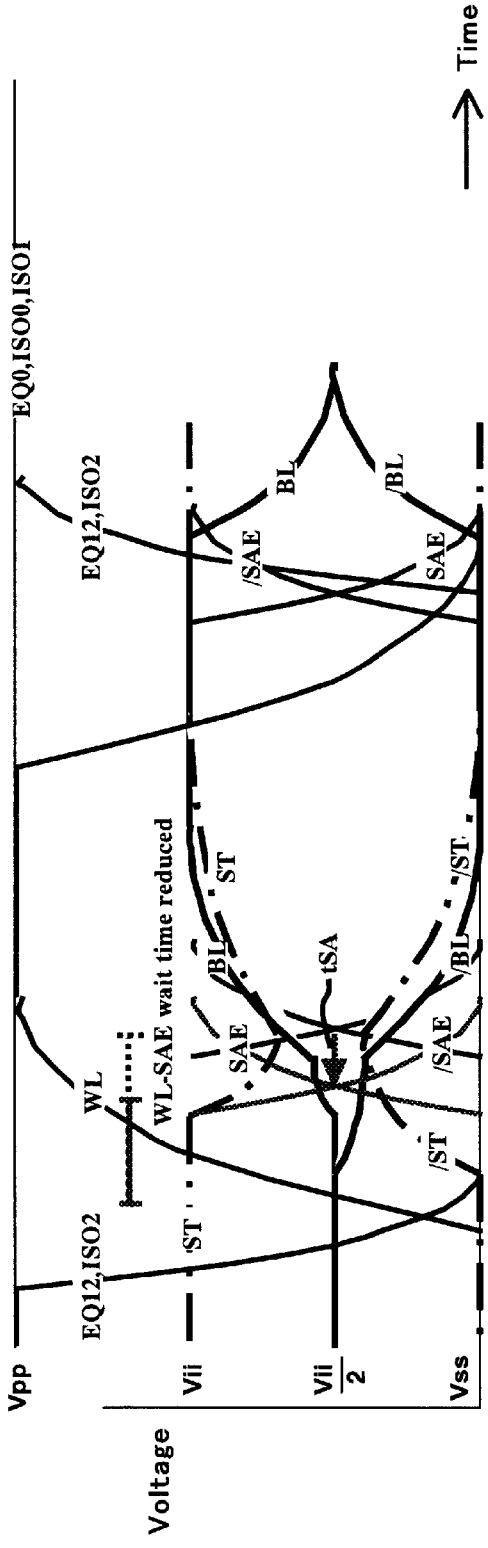
FIG. 5A Conventional DRAM Read/Restore
FIG. 5B Twin Cell DRAM Read/Restore

DRAM FOR STORING DATA IN PAIRS OF CELLS

BACKGROUND OF THE INVENTION

1. Field of the Invention

This invention relates to dynamic RAM (DRAM) to store data in pairs of cells, and particularly to DRAM which, through a twin-cell structure, is able to reduce power consumption, or is able to speed up the operation. In this Specification, such DRAM is referred to as "twin-cell DRAM."

2. Description of the Related Art

DRAM is large-capacity memory having memory cells consisting of one selection transistor (cell transistor) and one storage capacitor (cell capacitor). It is widely used as the cache memory in computers and in other applications.

In conventional DRAM, by driving a selected word line, the cell transistors connected to the word line are made conducting, cell capacitors are connected to bit lines, the bit line potential is raised or lowered according to whether there is or is not an electric charge on the cell capacitor, and this charge is read by a sense amplifier. Here in order to increase the read sensitivity, another bit line connected to the sense amplifier is used as a reference potential.

That is, in conventional DRAM, data 1's and 0's are stored by either accumulating or not accumulating electric charge in a single cell capacitor. This state is reflected in the potential of one bit line, and using the potential of the other bit line as a reference potential, the sense amplifier reads the data stored in the cell.

FIG. 9 is a drawing showing the configuration of conventional DRAM. In FIG. 9, sense amplifier blocks S/A0, S/A1 containing sense amplifier circuits are arranged on both sides of the memory cell array MCA. Within the memory cell array MCA are arranged plural word lines WL0 to WL5, and plural bit lines BL0, /BL0 and BL1, /BL1 intersecting with the former; at the positions of intersection are positioned memory cells MC00, etc. Consisting of a cell transistor and cell capacitor. The bit line pair BL0, /BL0 are connected to the sense amplifier block S/A0, and the bit line pair BL1, /BL1 is connected to the sense amplifier block S/A1.

Within the sense amplifier block S/A1 are provided bit line transfer gates BLT1, /BLT1, a precharge circuit PR1, a sense amplifier circuit SA1, and a column gate CLG. The bit line transfer gates BLT2, /BLT2 are connected to a bit line pair within a memory cell array on the right side, not shown.

Read operations in the conventional DRAM of FIG. 9 are as follows. During the precharge interval, the bit line pair BL1, /BL1 is precharged to a precharge level VBL by activation of an equalizing signal EQ12. This precharge level is normally the voltage Vii/2(Vcc/2) intermediate between the cell voltage and bit line voltage Vii(Vcc) on the H-level side, and the ground voltage on the L-level side. Next, when the word line WL2 is selected and driven, the transistors of the memory cells MC21, MC20 are made conducting, and the potentials of the bit lines BL1, BL0 change according to the cell voltages. The sense amplifier SA1 within the sense amplifier block S/A1 is activated by the activation signals SAE, /SAE, the voltage difference between the bit lines BL1 and /BL1 is detected, and the bit line pair BL1, /BL1 is amplified to either the power source voltage Vii(Vcc) or to ground voltage Vss by the sense amplifier SA1. Finally, the column gate CLG is made conducting by activation of the column select signal CL, and the voltage amplified by the sense amplifier is read to the data bus lines DB, /DB.

Presently the word line WL2 drops, the amplified bit line potential is retained in the memory cell MC21, rewriting is performed, the sense amplifier is deactivated, and bit line precharge is performed.

As described above, in conventional DRAM a data 1 or 0 is stored in a single memory cell, and when the memory cell is selected, the potential of one bit line changes while the potential of the other bit line is used as a reference potential, and the stored data is read by the sense amplifier.

Because of this configuration, conventional DRAM is subject to various constraints. For example, the cell voltage in a memory cell which stores the H level must be kept at a prescribed high-voltage level higher than the reference voltage Vii/2, even when the voltage declines due to a leakage current. If the H-level cell voltage drops below this, the corresponding bit line potential can no longer be raised sufficiently, and detection by the sense amplifier becomes difficult. Hence in conventional DRAM, in order that data reading failure due to leakage current does not occur, refresh operations must be performed at prescribed time intervals.

Further, in conventional DRAM it is desirable that the word line driving potential be set higher than the H-level side cell voltage or bit line voltage by an amount equal to or greater than the cell transistor threshold voltage, in order that the H-level side cell voltage be made sufficiently high. This is because by setting the H-level side cell voltage sufficiently high, the bit line potential can be raised sufficiently during reading, and it becomes possible to read using the sense amplifier. And even if the cell voltage declines due to the leakage current, if the voltage is higher than a prescribed voltage above the bit line precharge level Vii/2, the bit line potential can be raised sufficiently, as described above.

Also, in conventional DRAM, during read operations the word line is driven at a sufficiently high level, and after drawing the charge within the memory cell onto the bit line sufficiently, it is desirable that the sense amplifier be activated. This is because in order to enable detection by the sense amplifier, the bit line potential must be raised sufficiently relative to the cell voltage H level. This operation invites slowing of operations.

The various constraints described above on the frequent refresh operation, on raising the word line to high voltage and on other operations, all invite increases in power consumption. In DRAM devices, large capacities have been achieved through advances in microminiature processing technology, but on the other hand, the drawback of large power consumption accompanying the fact that refresh operations are necessary and other circumstances, has not yet been adequately resolved. Conversely, conventional DRAM has the problem that if power consumption is reduced, operation is slowed.

As a DRAM which resolves the above problems, a twin-cell DRAM device has been proposed in which complementary data is stored in a pair of memory cells, and in reading this pair of memory cells is selected simultaneously, the complementary data read to a bit line pair, and the bit line pair is driven by a sense amplifier. For example, in Japanese Patent Publication No. S54-28252 (Great Britain Patent No. 1502334), Japanese Patent Laid-open No. S55-157194, Japanese Patent Laid-open No. S61-34790, and Japanese Patent Laid-open No. 8-222706 (U.S. Pat. No. 5,661,678) are described configurations for storing a single datum in two memory cells.

However, all of these previous methods merely describe how a single datum is simply stored in a pair of memory cells, complementary data is read to a bit line pair, and driving is performed by a sense amplifier. The twin-cell DRAM of these previous methods do result in larger operating margins for sense amplifiers, and refresh cycles can be lengthen to some extent; but problems remain, including the facts that all sense amplifiers operate simultaneously, and that the operating margin is reduced by crosstalk between neighboring bit lines.

SUMMARY OF THE INVENTION

The object of this invention is to provide a DRAM device with a novel structure, with reduced power consumption.

A separate object of this invention is to provide a DRAM device with a novel structure, which is able to lengthen refresh cycles and reduce power consumption.

In order to achieve the above objects, as one aspect of this invention, the DRAM is configured such that data to be stored is stored as complementary data in one pair of memory cells, and this pair of memory cells is connected to one pair of bit lines connected to a common sense amplifier in response to selection of the word line. That is, at the positions of intersection of the pair of bit lines connected to the sense amplifier and the single word line, a pair of memory cells is positioned; by selecting the word line, complementary data is written from the pair of bit lines to the pair of memory cells, or complementary data is read to the pair of bit lines. The H level and L level are stored in the pair of memory cells as one bit of stored data, so that, as explained in the embodiment described below, the read sensitivity is increased, and refresh cycles can be made longer, or the word line driving level can be lowered, or the sense amplifier activation timing can be speeded.

Further, in this invention the bit lines comprising the first bit line pair are arranged in alternation with and surrounding the bit lines of a second bit line pair; the sense amplifier for the first bit line pair is positioned on one side of the cell array, and the sense amplifier for the second bit line pair is positioned on the other side of the cell array. The sense amplifier connected to either one bit line pair is activated according to the selected word line, the sense amplifier connected to the other bit line pair is kept in the inactive state, and the other bit line pair is kept at the precharge level. Through this configuration, only half the sense amplifier group of conventional devices is activated during reading or writing, so that power consumption can be reduced; moreover, the other bit line pair kept at the precharge level serves the function of shielding the one bit line pair driven by the sense amplifier, so that crosstalk between bit lines is reduced, and the operating margin of the sense amplifier of the one bit line pair can be increased.

In order to achieve these object, another aspect of this invention is a memory circuit having a plurality of memory cells, comprising: a memory cell array, having a plurality of bit line groups each having a first, second, third, and fourth bit line, arranged in order, a first word line group, connected to a pair of memory cells at positions of intersections with a first bit line pair including the first and third bit lines, a second word line group, connected to a pair of memory cells at positions of intersections with a second bit line pair including the second and fourth bit lines;

a first sense amplifier group, positioned on one side of the memory array, and connected to the first bit line pair; and, a second sense amplifier group, positioned on the other side of the memory array, and connected to the second bit line pair;

wherein complementary data corresponding to a stored data is written to the pair of memory cells from the bit line pair in response to one word line being driven, and moreover, the complementary data stored in the pair of memory cells is read to the bit line pair in response to one word line being driven;

when any one of the word lines of the first word line group is driven, the first sense amplifier group is activated so that the first bit line pair is driven in reverse phase, and the second sense amplifier group is kept in the inactive state so that the second bit line pair is kept at the precharge level; and, In a preferred embodiment of the above invention, there is further a precharge circuit which precharges the bit line pair to a precharge level; and, the voltages corresponding to the complementary data written to the pair of memory cells are a first voltage, higher than the precharge level, and a second voltage, lower than the precharge level.

In a still more preferred embodiment, in the above, refresh operations are performed after the first voltage in at least one pair of memory cells has dropped below the precharge level.

In a still more preferred embodiment, in the above, the sense amplifier amplifies one line of the bit line pair to the H level and the other to the L level, and the driving level of the selected word line is set such that the voltage on the H-level side written to the memory cells is lower than the H level of the bit line pair.

In a still more preferred embodiment, in the above, the sense amplifier is activated before the selected word line reaches its driving level, so that the potential of the bit line pair is amplified.

BRIEF DESCRIPTION OF THE DRAWINGS

FIGS. 2A and 2B is a diagram of the operating waveforms for reading and writing twin-cell DRAM in this preferred embodiment.

FIGS. 3A and 3B is a diagram of the operating waveforms Page showing the retention characteristics of memory cells.

FIGS. 4A and 4B is a diagram of the another operating Page waveforms of twin-cell DRAM in the preferred embodiment.

FIGS. 5A and 5B is a diagram of the another operating waveforms of twin-cell DRAM in the preferred embodiment.

DESCRIPTION OF THE PREFERRED EMBODIMENTS

Below, preferred embodiments of this invention are explained with reference to the drawings. However, these preferred embodiments do not limit the technical scope of this invention.

Figure 1:
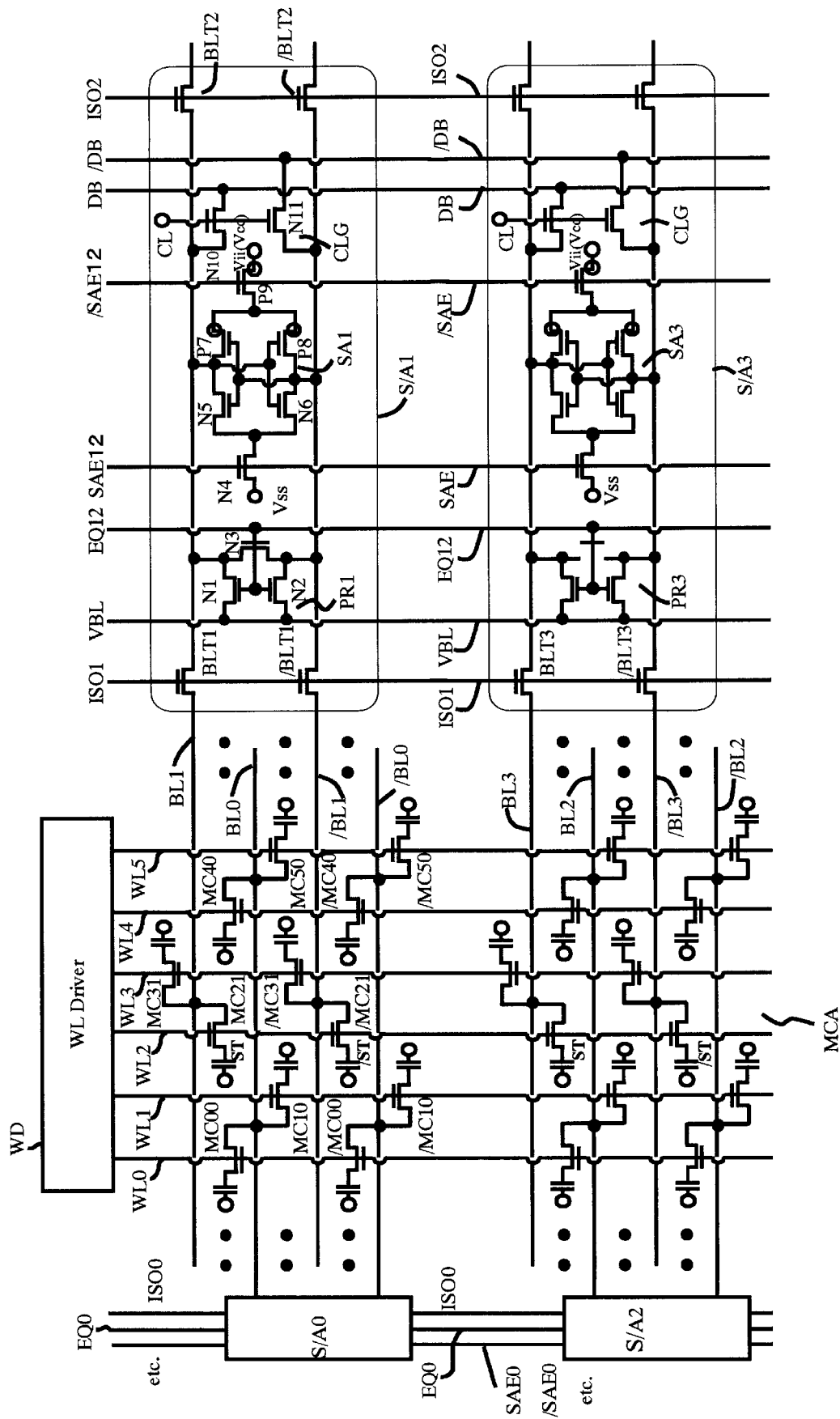
FIG. 1 is a diagram of the configuration of the memory circuit in a preferred embodiment.
Figure 9:
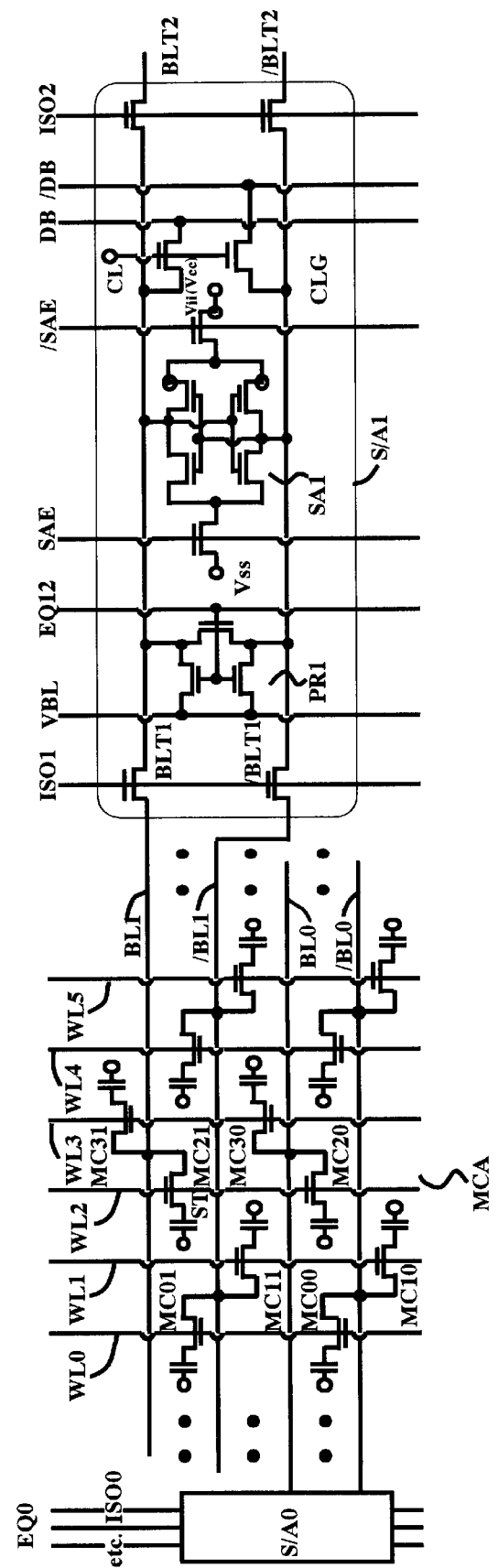
FIG. 9 is a diagram of the configuration of conventional DRAM.

FIG. 1 is a diagram of the configuration of the memory circuit in a preferred embodiment. The memory circuit in this preferred embodiment stores complementary data corresponding to the stored data in a pair of memory cells (twin cells) connected to a bit line pair, which is connected to a sense amplifier, in response to one word line being driven. In this twin-cell DRAM, the positioning of bit lines and word lines, as well as the memory cells at the points of intersection of these in the memory cell array, are basically the same as for the conventional DRAM shown in FIG. 9. The configuration of the sense amplifier block is also the same as in previous instances.

The twin-cell DRAM differs from conventional devices in that a pair of memory cells are connected simultaneously to the bit line pair to which the sense amplifier is connected, in response to a single word line being driven. Consequently the specific difference in configurations is, as is clear from FIG. 9 and FIG. 1, that whereas in the conventional DRAM of FIG. 9 the bit line pair continuing from the top are connected to one sense amplifier block S/A1 (on the right side), and the next bit line pair is connected to the sense amplifier block S/A0 (on the left side), in the twin-cell DRAM of FIG. 1, bit line pair consisting of the odd-numbered bit line counting from the top BL1, /BL1 are connected to one of the sense amplifier blocks S/A1 (on the right side), and bit line pair consisting of the even-numbered bit line counting from the top BL0, /BL0 are connected to the other sense amplifier block S/A0 (on the left side).

The configuration of a twin-cell DRAM of this preferred embodiment is explained with respect to FIG. 1. In the memory cell array MCA are arranged six word lines WL0 to WL5 and eight bit lines BL0, /BL0 to BL3, /BL3. The bit line pair BL0, /BL0 is connected to the left-side sense amplifier block S/A0, and the bit line pair BL1, /BL1 is connected to the right-side sense amplifier block S/A1; further, the bit line pair BL2, /BL2 is connected to the left-side sense amplifier block S/A2, and the bit line pair BL3, /BL3 is connected to the right-side sense amplifier block S/A3.

When the word line WL0 is selected, the cell transistors of the pair of memory cells MC00, /MC00 are made conducting, and the cell capacitors thereof are connected to the bit line pair BL0, /BL0. Similarly, when the word line WL1 is selected, the cell transistors of the pair of memory cells MC10, /MC10 are made conducting, and the cell capacitors thereof are connected to the bit line pair BL0, /BL0. On the other hand, when the word line WL2 is selected, the cell transistors of the pair of memory cells MC21, /MC21 are made conducting, and the cell capacitors thereof are connected to the bit line pair BL1, /BL1. Similarly, when the word line WL3 is selected, the cell transistors of the pair of memory cells MC31, /MC31 are made conducting, and the cell capacitors thereof are connected to the bit line pair BL1, /BL1. When the word line WL4 or WL5 is selected, the pair of memory cells MC40, /MC40 or MC50, /MC50 is respectively connected to the bit line pair BL0, /BL0.

Each of the pairs of memory cells MC00, /MC00, MC10, /MC10, MC21, /MC21, MC31, /MC31, MC40, /MC40, and MC50, /MC50 comprises a storage unit for storing one bit of data. And, each pair of memory cells stores the complementary data corresponding to the stored data. That is, when H level is recorded in one of a pair of memory cells, L level is recorded in the other. In the case where the opposite data is recorded, L level is recorded in one of the pair of memory cells, and H level is recorded in the other. And, when a selected word line is driven, a pair of memory cells is simultaneously connected to a bit line pair, and a prescribed voltage difference occurs between the potentials of said bit line pair, corresponding to the complementary data which had been recorded. This voltage difference is detected by the sense amplifier, and the bit line pair potential difference is amplified.

FIG. 1 shows the word line driver circuit WD which drives each word line. In FIG. 1, the circuits of the right-side sense amplifier blocks S/A1, S/A3 are shown; the circuits of the left-side sense amplifier blocks S/A0, S/A2 are similarly configured. An explanation of the circuit configuration follows, for the example of the sense amplifier block S/A1. Within the sense amplifier block S/A1 are provided bit line transfer gates BLT1, /BLT1, which are made conducting or non-conducting by an isolation signal IS01; a precharge circuit PR1 consisting of N-channel transistors N1, N2, N3; a sense amplifier circuit SA1 consisting of N-channel transistors N4, N5, N6 and P-channel transistors P7, P8, P9; a column gate CLG consisting of N-channel transistors N10, N11; and other bit line transfer gates BLT2, /BLT2.

In the precharge circuit PR1, by setting the equalize signal EQ12 which is the precharge signal to H level, the bit line pair is short-circuited by the transistor N3, and the bit line pair BL1, /BL1 is precharged to the precharge voltage VBL by the transistors N1, N2. In the sense amplifier circuit SA1, the transistor N4 is connected to ground potential Vss, and the transistor P9 is connected to the stepped-down internal power supply voltage Vii (or external power supply voltage Vcc), which is the H-level cell voltage. When the sense amplifier activation signals SAE12 and /SAE12 go to H level and L level respectively, the sense amplifier circuit SA1 is activated. And when the column select signal CL goes to H level, the column gate CLG is made conducting, and the bit line pair BL1, /BL1 is connected to the data bus line pair DB, /DB.

FIG. 2 is a diagram of the operating waveforms for reading and writing twin-cell DRAM in this preferred embodiment. FIG. 2A shows the read operation, and FIG. 2B shows the write operation. In the figures, the horizontal axis indicates time, and the vertical axis indicates voltage; in this example, the H-level side bit line voltage is set to the internal power supply voltage Vii, the L-level side bit line voltage is set to the ground voltage Vss, the bit line precharge level is set to the voltage Vii/2 intermediate between these, and the word line WL driving level is set to the stepped-up voltage Vpp.

As shown in FIG. 2A, in a read operation the bit line pair BL, /BL is precharged to the precharge level Vii/2, the equalize signal EQ12 drops to L level, and the precharge circuit PR1 is inactivated. The isolation signal IS01 corresponding to the unselected-side memory cell array also drops to L level, and the bit line transfer gates BLT2, /BLT2 become non-conducting.

In this state, when a word line WL (for example WL2) is selected, the word line WL is driven from ground voltage Vss to the stepped-up voltage Vpp. In response to this, the cell transistors of the pair of memory cells MC21, /MC21 is made conducting. If it is supposed that H level is recorded in the memory cell M21 and L level is recorded in memory cell /MC21, then this is accompanied by a slight increase in the voltage of the bit line BL1 from the precharge level Vii/2 and a slight decrease in the voltage of the bit line /BL1 from the precharge level Vii/2. These slight voltage changes are determined by the cell voltage and by the ratio of the capacitance of the cell capacitors to the stray capacitance of the bit lines.

When a voltage difference appears in the bit line pair BL1, /BL1, the sense amplifier activation signals SAE12, /SAE12 go to H level and L level respectively, and the sense amplifier circuit SA1 is activated. As a result the bit lines BL1, /BL1 are amplified to H level and L level respectively, and the cell voltages ST, /ST in the memory cells are driven to H level (internal power supply voltage Vii) and to L level (ground potential Vss).

Presently the word line WL2 drops to L level, and the rewritten (restored) complementary data is held in a pair of memory cells. Thereafter the sense amplifier activation signals SAE12, /SAE12 are set to L level and H level respectively, the equalize signal EQ12 and isolation signal IS01 are both set to H level, and the bit line pair is precharged.

As is clear from FIG. 2A, complementary data is recorded to a pair of memory cells, and these are read to the bit line pair, so that when the word line WL level has risen, a larger voltage difference than in conventional cases appears in the bit line pair. Hence the sensing and amplification actions of the sense amplifier are speeded, and erroneous read operations are reduced.

The write operation shown in FIG. 2B is as follows. Here an explanation is given for the case in which H level and L level are recorded in memory cells MC21 and /MC21 respectively, similar to the read operation, and inverting data is written to the pair of memory cells MC21, /MC21. Up until the precharge operation is released, the word line WL is driven and the sense amplifier SA1 is activated, the operation is the same as in the read operation described above. In this state, the column gate CGL is conducting; when, by means of a write amplifier (not shown) connected to the data bus line pair DB, /DB, the bit line pair is driven to inverted states, the levels of the bit line pair BL, /BL and of the cell voltages ST, /ST are inverted, as shown in the FIG. 2B. Thereafter the word line WL drops to L level, and the written complementary data is held in a pair of memory cells. Then the sense amplifier activation signals SAE12, /SAE12 are set to L level and H level respectively, the equalize signal EQ12 and isolation signal IS01 are both set to H level, and the bit line pair is precharged.

As indicated in FIG. 1 and FIG. 2, when the word line WL2 is selected, a pair of memory cells are connected to the bit line pairs BL1, /BL1 and BL3, /BL3, and no memory cells are connected to the bit line pairs BL0, /BL0 and BL2, /BL2. Hence there is no need to activate the sense amplifier block group S/A0, S/A2 on the left side of FIG. 1, and only the sense amplifier block group S/A1, S/A3 on the right side of FIG. 1 need be activated.

Hence when the word lines WL0, 1, WL4, 5 are selected, the complementary data of a pair of memory cells is read to bit line pairs BL0, /BL0, BL2, /BL2, the left-side sense amplifiers S/A0, S/A2 are activated, and bit line pairs are driven. On the other hand, the memory cells of bit line pairs BL1, /BL1, BL3, /BL3 are not selected, the right-hand sense amplifiers S/A1, S/A3 are not activated, and the bit line pairs BL1, /BL1, BL3, /BL3 are kept at precharge level. When the word lines WL2, 3 are selected, the right-side sense amplifiers are activated, and the left-side sense amplifiers are kept in the unactivated state.

FIG. 3 is a diagram of operating waveforms showing the retention characteristics of memory cells. FIG. 3A shows the retention characteristics of conventional DRAM; FIG. 3B shows the retention characteristics of a twin-cell DRAM of this preferred embodiment. Here retention characteristics are characteristics enabling the reading of the H level of a cell, even when the H-level side cell voltage ST declines due to leakage current via the memory cell PN junction or elsewhere. FIG. 3A and B show diagrams of the waveforms of read operations when the H-level side cell voltage ST has declined in each of the respective devices.

As indicated in FIG. 3A, in conventional DRAM, even if there is a decline in the H-level side cell voltage ST due to leakage current, so long as the voltage is above a level V1 a prescribed voltage ΔV higher than the bit line precharge level Vii/2, the H level is detected by the sense amplifier. Here if the capacitance of the cell capacitor is Cs, and the stray capacitance of the bit line is Cb1, then in the situation that the cell voltage ST of the bit line on the H-level side dropped to voltage V1, when the word line WL is driven to cause the cell transistor to be conducting, the voltage difference ΔVBL between the bit lines BL and /BL is given by ΔVBL=ΔV*Cs/(Cs+Cb1).

In the twin-cell DRAM of this embodiment, on the other hand, as shown in FIG. 3B, normal reading is possible even if the H-level side cell voltage drops to a voltage V2 lower than the bit line precharge level Vii/2 due to leakage currents. That is, in twin-cell DRAM the L level is always recorded in one of the memory cells, and so this can be utilized in normal reading, the embodiment is not easily affected by leakage currents.

The L-level side cell voltage /ST is at ground voltage Vss, and there is no fluctuation in level due to leakage currents. On the other hand, suppose that the cell voltage ST on the H-level side declines to below the bit line precharge level Vii/2, to a voltage V2 higher by an amount ΔV than the ground voltage Vss. In this case, due to the cell voltage /ST on the L-level side, the voltage of the bit line /BL declines by a voltage according to the voltage difference between the precharge voltage Vii/2 and ground voltage. The cell voltage ST on the H-level side is decreased to voltage V2, and so the voltage of the bit line BL decreases by a voltage according to the voltage difference between the precharge voltage Vii/2 and the lower voltage V2. Eventually, the voltage difference ΔVBL between the bit lines BL, /BL is, as in the conventional case, ΔVBL=ΔV*Cs/(Cs+Cb1).

That is, in the case of twin-cell DRAM, the L level (ground voltage Vss) is always held in one of the memory cells, so that as explained above, retention characteristics are improved relative to conventional DRAM. Put another way, by using the retention characteristics, the refresh operation specific to DRAM may be performed after the cell voltage on the H-level side has dropped to a level (for example V2) below the bit line precharge level, as shown in FIG. 3B. This in turn means that in twin-cell DRAM, the cycle time for refresh operations may be set longer than for conventional DRAM. By extending the refresh cycle, overall power consumption can be greatly reduced.

However, cell voltage retention characteristics are such that when the voltage is high, a large leakage current flows, and the voltage declines sharply; but once the cell voltage has dropped, the leakage current is decreased, and the rate of level decline slows. Hence refresh cycles in twin-cell DRAM can be extended by two times or more times compared with a conventional DRAM, in fact by three to five times or longer.

As is clear from the operating characteristics of FIG. 3, in the configuration of the twin-cell DRAM of this embodiment, refresh operations are performed after the cell voltage on the H-level side has dropped below the bit line precharge voltage. By means of this configuration, overall power consumption can be reduced below that of conventional devices. This can be achieved by setting the refresh cycle according to the cell leak characteristic.

FIG. 4 is a diagram of the another operating waveforms of twin-cell DRAM of this embodiment. In FIG. 4A and FIG. 4B, read operation for conventional DRAM and read operation for twin-cell DRAM of this embodiment are shown, respectively.

FIG. 3 shows a configuration in which the refresh cycle is extended compared with the conventional case, utilizing the fact that in twin-cell DRAM L-level data is always recorded in one of the memory cells. On the other hand, FIG. 4 shows a configuration in which the H-level side cell voltage is made lower than the H-level side bit line level, utilizing the fact that in twin-cell DRAM L-Level data is always recorded in one of the memory cells. Specifically, the word line driving level is set to a lower level such as that shown in FIG. 4B, and not to a stepped-up level Vpp as in conventional methods such as that shown in FIG. 4A. The cell voltage ST on the H-level side is lower, by the amount of the cell transistor threshold voltage Vth, than the driving level of the word line WL, and the cell voltage ST is lower than the H-level side bit line level Vii.

For the conventional DRAM of FIG. 4A, the bit line precharge level Vii/2 is the sense amplifier reference voltage. Hence it is desirable that the H-level side cell voltage ST be as high as possible. To this end, in conventional devices, the word line WL driving level is set to the stepped-up voltage Vpp, raised at least by the cell transistor threshold voltage Vth above the H-level side bit line level Vii. That is, the word line driving level vpp is set to a level higher by the threshold voltage Vth (V3) than the H-level side bit line level Vii. To this extent, power consumption for word line driving is unavoidable.

In contrast, in the twin-cell DRAM of FIG. 4B, the word line driving level is set lower than in conventional devices. As a result, the H-level side cell voltage ST is lower by the amount of the threshold voltage Vth than the word line driving level. Conversely, the voltage difference V4 between the word line driving level and the H-level side bit line level is lower than the threshold voltage Vth of the cell transistor.

Even if, as described above, the word line driving level is lowered and the H-level side cell voltage ST is reduced to below the H-level side bit line level, in the case of twin-cell DRAM, normally reading is possible. In twin-cell DRAM, L level is always held in one of the memory cells. Hence in response to word line driving, the bit line /BL on the side of the memory cell holding the L level is reduced by a prescribed voltage according to the L level. The bit line BL on the side of the memory cell holding the H level rises by a prescribed voltage according to the H level. The voltage difference generated by the bit line pair at this time is larger than the voltage difference of the bit line pair in the case of FIG. 4A. Hence even in twin-cell DRAM where the H-level side cell voltage has dropped, satisfactory data reading is possible.

In this embodiment, the word line driving level is lowered. Hence power consumption accompanying word line driving can be reduced below that of conventional devices. The word line driving level may be set to the internal power supply voltage Vii, which is the H-level side bit line potential. That is, word lines have the same swing level as bit lines, so that power consumption can be greatly reduced.

FIG. 5 is a diagram of the another operating waveforms of twin-cell DRAM of this embodiment. In this twin-cell DRAM, the timing of activation of sense amplifiers is set to before the driving level of the selected word line WL is reached. That is, in the conventional DRAM of FIG. 5A, the word line WL is driven at a stepped-up voltage Vpp, which is the driving level, and after the H-level side cell voltage ST is sufficiently read to the bit line BL, the sense amplifier is activated. On the other hand, in the twin-cell DRAM of the embodiment of FIG. 5B, the sense amplifier is activated before the word line WL reaching the stepped-up voltage Vpp which is the word line WL driving level, utilizing the fact that the L level is always recorded in one of the memory cells. That is, as indicated by the arrow tSA in the figure, the timing of the activation signals SAE, /SAE is advanced.

In conventional DRAM, even when the word line WL is driven, the level of the reference-side bit line /BL does not vary from the precharge level Vii/2. Hence the voltage difference Δv across a bit line pair is generated by the voltage increase on the side of the bit line BL which changes according to the H-level side cell voltage ST. Thus in conventional DRAM, it is necessary to wait until the word line WL is raised sufficiently to the driving level, and the rise in bit line BL level due to the cell voltage ST is completed, that is, until the cell voltage ST and bit line level are equal, before activating the sense amplifier. In the figure, the time denoted as "WL-SAE wait time" is the time from word line WL driving until sense amplifier activation.

In contrast, in twin-cell DRAM the sense amplifier A activation signals SAE, /SAE are set to H level and L level to activate the sense amplifier before the selected word line WL rises to the driving level Vpp. When the level of the word line WL rises by the amount of the cell transistor threshold voltage Vth above ground voltage Vss, the L-level side cell transistor is made conducting, and the bit line /BL is lowered from precharge level. Then, when the word line WL is raised by the amount of the cell transistor threshold voltage Vth above the bit line precharge level Vii/2, the H-level side cell transistor is made conducting, and the bit line BL is raised from precharge level.

In order to read the data stored in a cell, it is sufficient that the decline in level of the bit line due to the L-level side cell voltage has ended; hence the sense amplifier can be activated without waiting for completion of the rise in level of the bit line BL due to the H-level side cell voltage. As shown in FIG. 5B, it is also possible to activate the sense amplifier before the H-level side cell voltage ST reaches the same potential as the bit line BL. That is, the timing for activation of the sense amplifier can be advanced from the conventional case by the amount of the arrow tSA.

As shown in FIG. 3B, when the H-level side cell voltage has dropped still further below the precharge level due to leakage currents, the level of the bit line BL also drops due to the cell voltage decline, in response to word line WL driving. In this case, by advancing the sense amplifier activation timing as in FIG. 5B, the sense amplifier can be activated while the voltage difference across the bit line pair is large, so that sensing and amplification operations can be performed, which is more desirable with respect to read sensitivity.

Figure 6:
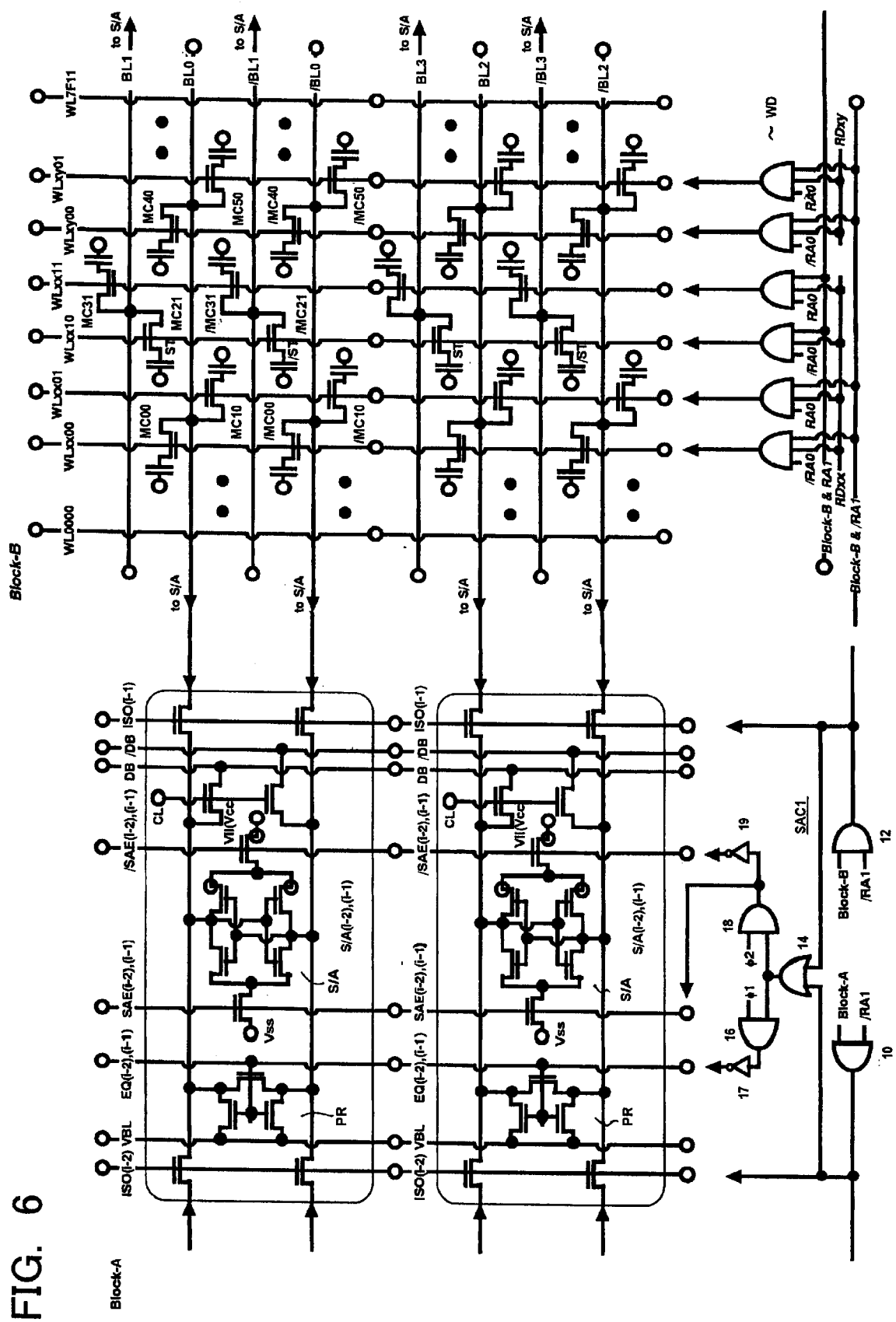
FIG. 6 is a detailed circuit diagram of the twin-cell DRAM of FIG. 1.
Figure 7:
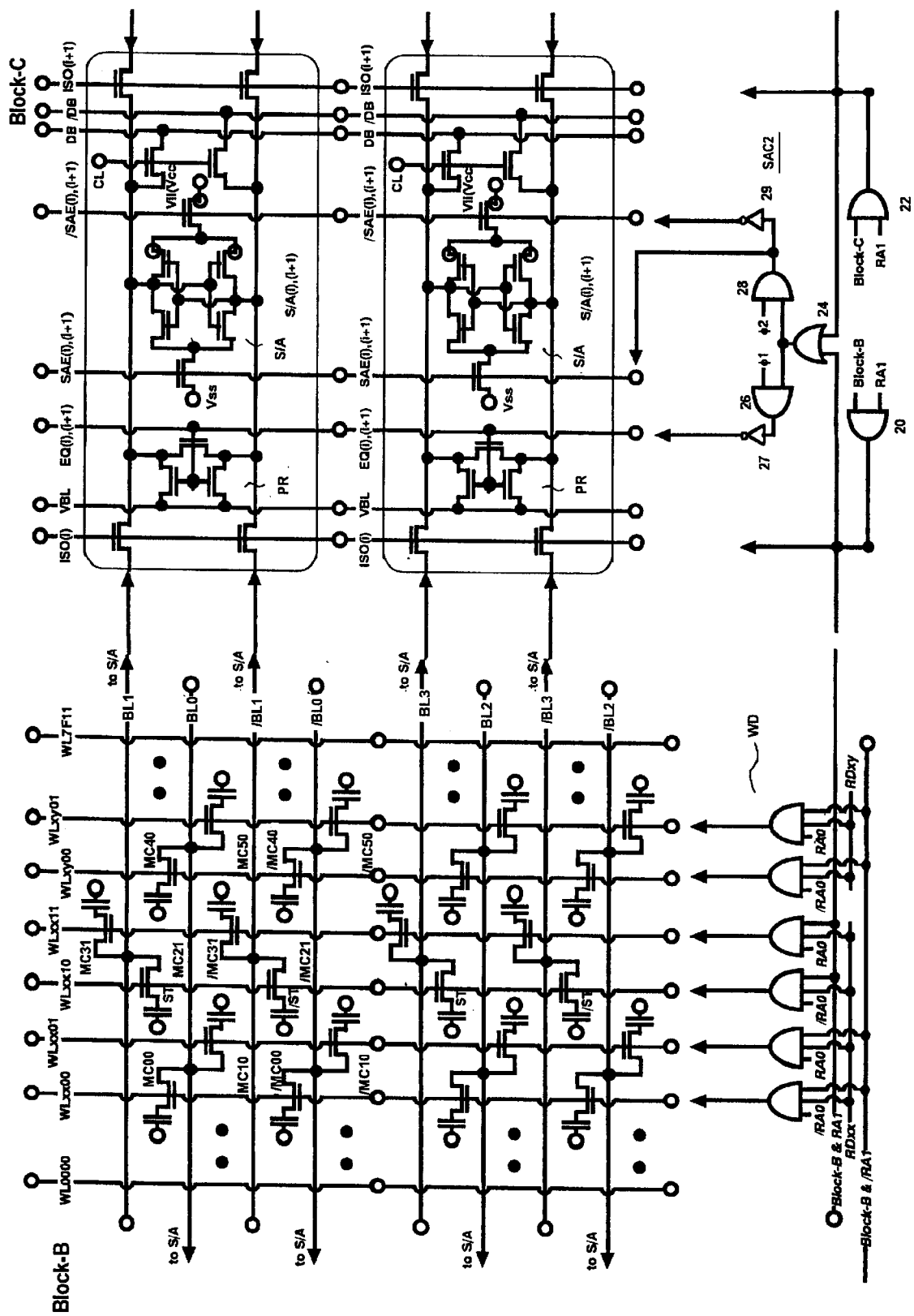
FIG. 7 is a detailed circuit diagram of the twin-cell DRAM of FIG. 1.

FIGS. 6 and 7 are detailed circuit diagrams of the twin-cell DRAM of FIG. 1. In FIG. 6, a sense amplifier group is shown on the left side, and the cell array Block B on the right side; in FIG. 7, the same cell array Block B as in FIG. 6 is shown on the left side, and a sense amplifier group is shown on the right. Hence by combining FIGS. 6 and 7, the arrangement of sense amplifier groups on both sides of the cell array, shown in FIG. 1, is obtained. On the left side of the sense amplifier group in FIG. 6 is positioned another cell array block A, not shown; on the right side of the sense amplifier group in FIG. 7 is positioned, another cell array block C, not shown. That is, the cell array blocks A, B share the sense amplifiers S/A(i−2),(i−1), and the cell array blocks B, C share the sense amplifiers S/A(i),(i+1).

In the figure, the cell array block B is positioned in the same way as the cell array of FIG. 1, and the same reference numbers are assigned to the memory cells and bit line pairs; however, different reference numbers are assigned to word lines. Further, six AND gates are shown as an example of a word driver WD. Within the cell array block B are arranged, in order, the first bit line BL1, second bit line BL0, third bit line /BL1, and fourth bit line /BL0; the first bit line pair, consisting of the first and third bit lines BL1, /BL1, is connected to the sense amplifier S/A(i),(i+1) on the right side of the cell array, and the second bit line pair, consisting of the second and fourth bit lines BL0, /BL0, is connected to the sense amplifier S/A(i−2),(i−1) on the left side of the cell array. Similarly for the bit lines BL3, BL2, /BL3, /BL2.

As is clear from the arrangement of memory cells in the cell array, when any one of the lines of the second word line group WLxx00, WLxx01, WLxy00, WLxy01 is selected and driven, the data of the memory cells for the second bit line pair BL0, /BL0 is read. Hence in this case, the left-side sense amplifier group S/A(i−2),(i−1) is activated. Thus the sense amplifier control circuit SAC1 is activated by the logical sum of the row address /RA1 and the cell array selection signals Block-A, -B, generated by the AND gates 10, 12 and deactivation of the precharge circuit PR and activation of the sense amplifier S/A are controlled in response to timing signals φ1, φ2. For example, when the word line WLxx00 is selected, the row address /RA1 is H level, and the cell array selection signal Block-B is also at H level. Hence the output of the AND gate 12 is H level, the bit line transfer signal ISO(i—1) is H level, and the second bit line pairs BL0, /BL0, BL2, /BL2 are connected to the sense amplifier group S/A(i−2),(i−1). And, in response to the timing signal φ1 to deactivate the precharge circuit PR, the output of the AND gate 16 is H level and the output of the inverter 17 is L level, so that the precharge circuit PR within the sense amplifier group S/A(i−2),(i−1) is deactivated. Thereafter, in response to the sense amplifier activation timing signal φ2, the output of the AND gate 18 is H level, and the sense amplifier S/A within the sense amplifier group S/A(i−2),(i−1) is activated. As a result, the second bit lines BL0, /BL0, BL2, /BL2 are driven.

Here the row address RA1 is at L level, so the output of the AND gate 20 to which the row address RA1 and cell array select signal Block-B are input remains at L level; the unselected cell array select signal Block-C is also at L level, so that the output of the AND gate 22 also remains at L level. As a result, the output of the OR gate 24 is at L level, and the deactivated state of the sense amplifier group S/A(i),(i+1) on the right side in FIG. 7 is kept. Through the deactivated state of this sense amplifier group, the first bit line pairs BL1, /BL1, BL3, /BL3 are kept at the precharge level Vii/2.

When one of the aforementioned second word line group is selected, the left-side sense amplifier group is activated, and the right-side sense amplifier group is kept in the deactivated state; because of this, the following advantages for operation are obtained. Of the sense amplifier groups on the right and left sides, only one sense amplifier group is activated and driven, and so the power consumed by sense amplifiers is only one-half the normal value. Further, when the second bit line pairs BL0, /BL0, BL2, /BL2 are driven by the left-side sense amplifiers, the first bit line pairs BL1, /BL1, BL3, /BL3 positioned between these second bit line pairs are kept at the precharge level Vii/2, so that crosstalk to the second bit line pairs from the neighboring bit lines is suppressed. That is, the first bit line pairs play the role of shield lines for the second bit line pairs. By thus suppressing noise from neighboring bit lines, the operating margin of sense amplifiers is broadened, and refresh cycles can be made longer. By further extending refresh cycles, power consumption is reduced.

Conversely, when one of the first word line group WLxx10, WLxx11 is selected and driven, the data of a pair of memory cells is read to the first bit line pairs BL1, /BL1, BL3, /BL3, and the right-side sense amplifier group S/A(i), (i+1) is activated by the sense amplifier control circuit SAC2. On the other hand, the left-side sense amplifier group S/A(i−2),(i−1) is kept in the deactivated state. Hence the first bit line pairs BL1, /BL1, BL3, /BL3 are driven at H and L levels, but the second bit line pairs BL0, /BL0, BL2, /BL2 are kept at the precharge level. Thus similarly to the case described above, the second bit line pairs function as shield lines, and the operating margin of the sense amplifiers driving the first bit line pairs is broadened. The sense amplifier control circuit SAC2 has the same configuration and performs the same operation as the sense amplifier control circuit SAC1 described above.

As shown in the above embodiment, in twin-cell DRAM a single bit of data is held in a pair of memory cells as complementary data. Hence there always exists one memory cell in which the L level is held. By utilizing this feature, first of all, normal reading is possible even when the voltage of the H-level cell drops below the precharge level. Thus to this extent the refresh cycle can be set to a longer value.

Second, even if the H-level cell voltage is lowered, there is no hindrance of read operations. Hence the H-level cell voltage can be lowered below the H level of the bit line, and together with this, the need to raise the word line driving level to a value higher by a threshold voltage than the H-level side bit line level is eliminated.

Third, there is no need to change bit line levels due to the H-level side cell voltage. Hence it is also possible to activate the sense amplifier before the word line reaches the driving level.

By adopting the first or the second configuration, power consumption can be reduced; by adopting the third configuration, read and write operations can be speeded. Any of these configurations, or some combination thereof, may be selected as appropriate, in consideration of balance of the memory circuit overall.

Fourth, during reading or writing, only one of the sense amplifier groups provided on either side of the cell array is activated, whereas the other sense amplifier group is kept in a deactivated state. Hence the power consumption accompanying sense amplifier driving can be reduced.

Fifth, when a first bit line pair is driven, the second bit line pair placed between the former is kept at the precharge level, and so functions as shield lines; as a result the operating margin of the sense amplifier can be increased. Hence the refresh cycle can be lengthened, and power consumption suppressed.

Figure 8:
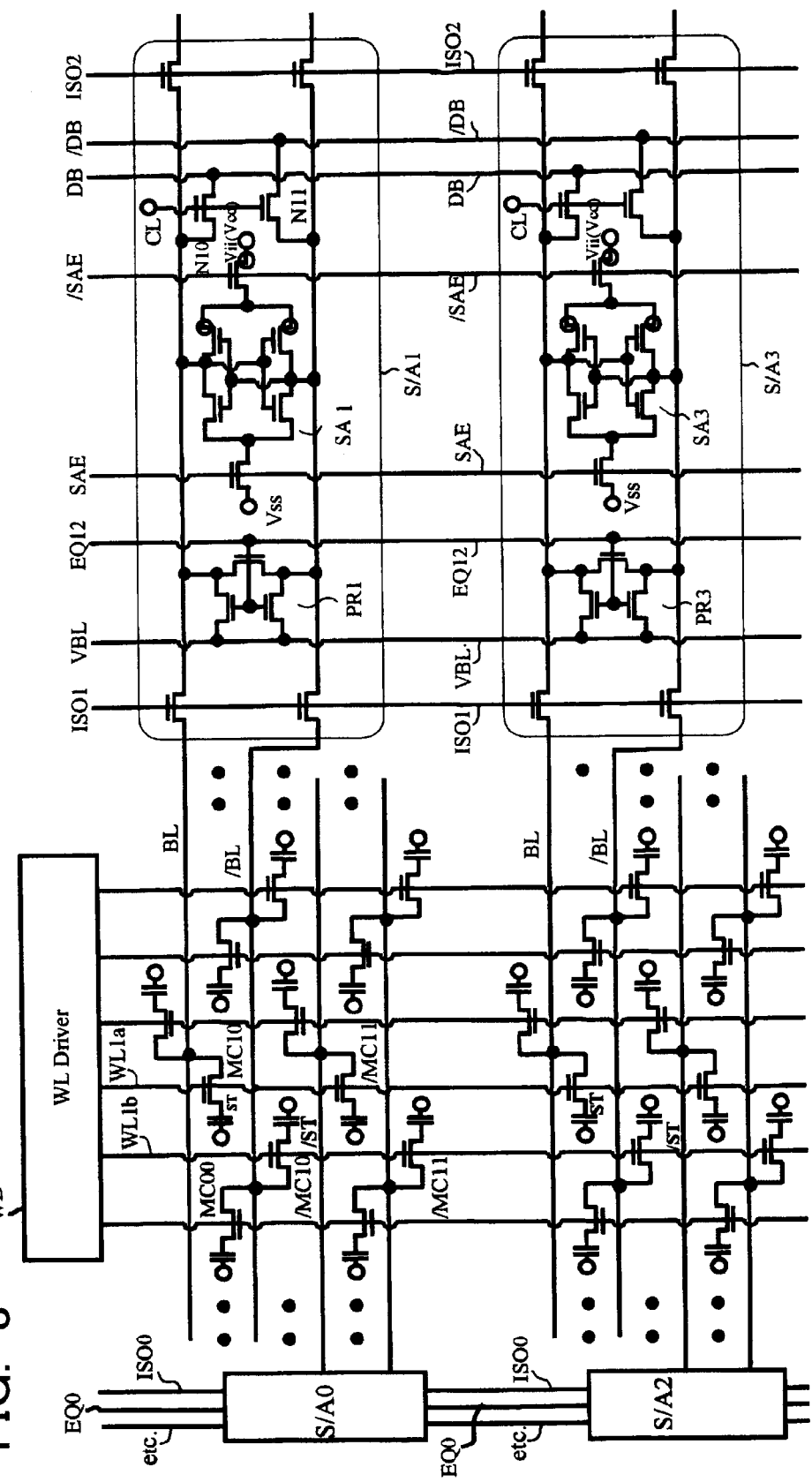
FIG. 8 is a detailed circuit diagram of another twin-cell DRAM.

FIG. 8 is a diagram showing the configuration of still another twin-cell DRAM. In the example of FIG. 1, when the word driver WD selects and drives a single word line, a pair of memory cells is connected to a pair of bit lines, and a voltage difference across the bit line pair corresponding to complementary data is generated. In the example of FIG. 8, the recording of a single bit of storage data in a pair of memory cells as complementary data is the same, but because of this, the word driver WD drives a pair of word lines, and one pair of memory cells is connected to a bit line pair. Hence in row access operation by the word driver WD, a pair of word lines is driven simultaneously for a row address.

That is, in FIG. 8, when the word driver WD simultaneously drives the pair of word lines WL1a, WL1b, the memory cells MC10, /MC10 and MC11, /MC11 are simultaneously connected to the bit lines BL and /BL respectively. By this means, complementary data is read to these bit line pairs, or else complementary data is written to the aforementioned memory cell pairs MC10, /MC10 and MC11, /MC11 via these bit line pairs. Reading of these memory cell pairs is performed by the sense amplifiers S/A1, S/A0. In the case of this example, a single word line pair is always driven, and a pair of memory cells holding complementary data must always be selected. However, the rest of the configuration employs the same memory circuit as in FIG. 1.

In the example of FIG. 8, the sense amplifiers on both sides must be activated for reading and for writing. Hence by changing the arrangement of memory cells in the cell array such that, when a single word line pair is driven, complementary data is read to a single bit line pair only, and complementary data is not read to the second bit line pair, it is possible to activate one sense amplifier group only, as in the example of FIG. 1.

In the case of the embodiment shown in FIG. 8 also, the refresh cycle can be shortened, the word line driving level can be lowered, and the timing of sense amplifier activation can be advanced to before the word line reaches the driving level. Hence power consumption can be reduced, or read and write operations can be speeded.

The scope of protection of this invention is not limited by the embodiments described above, but extends to the invention described in the scope of patent claims and to equivalent devices.

By means of this invention, complementary data is held in a pair of memory cells, and so cell arrays using conventional one-transistor, one-capacitor type memory cells can be employed without alteration, and memory cells can be realized which enable high read sensitivity as well as either low power consumption or high-speed operation. Moreover, upon word line driving, data is read to the first bit line pair, which is driven by a sense amplifier, but no data is read to the second bit line pair, which is kept at precharge level. Consequently power consumption by sense amplifiers can be reduced, and crosstalk in the first bit line pair can be reduced through the shielding effect of the second bit line pair.

One pair of memory cells is required to record one bit of data. However, the special properties of large-capacity DRAM are utilized, and reductions in power consumption or faster operation can be achieved without so great a sacrifice of memory capacity.

What is claimed is:

1. A memory circuit comprising:

a memory cell array, having a plurality of bit line groups each having a first, second, third, and fourth bit line, arranged in order, a first word line group, connected to a pair of memory cells associated with a first bit line pair including said first and third bit lines, and a second word line group, connected to a pair of memory cells associated with a second bit line pair including said second and fourth bit lines;

a first sense amplifier group, positioned on one side of said memory array, and connected to said first bit line pair; and, a second sense amplifier group, positioned on the other side of said memory array, and connected to said second bit line pair; wherein:

complementary data corresponding to a storage data is written to said pair of memory cells from said bit line pair in response to one word line being driven, and moreover, said complementary data stored in said pair of memory cells is read to said bit line pair in response to one word line being driven;

when any one of the word lines of said first word line group is driven, said first sense amplifier group is activated so that said first bit line pair is driven in reverse phase, and said second sense amplifier group is kept in the inactive state so that said second bit line pair is kept at the precharge level.

2. The memory circuit of claim 1, further comprising:

a precharge circuit for precharging said bit line pairs to a precharge level, wherein the voltages corresponding to complementary data written to said pairs of memory cells are a first voltage higher than said precharge level, and a second voltage lower than said precharge level.

3. The memory circuit of claim 2, wherein:

refresh operations are performed after said first voltage in at least one pair of memory cells has dropped below said precharge level.

4. The memory circuit of claim 2, wherein:

said sense amplifier amplifies one line of said bit line pair to the H level and the other to the L level, and the driving level of said selected word line is set such that the voltage on the H-level side written to said memory cells is lower than the H level of said bit line pair.

5. The memory circuit of claim 2, wherein:

said sense amplifier is activated before said selected word line reaches a driving level, and the potential of said bit line pair is amplified.

6. The memory circuit of claim 1, wherein:

said first sense amplifier group is activated in response to a selection signal of said memory cell array and a selection signal of said first word line group, and said second sense amplifier group is activated in response to a selection signal of said memory cell array and a selection signal of said second word line group.

* * * * *